(12) United States Patent
Kishimoto

(10) Patent No.: US 7,354,804 B2
(45) Date of Patent: Apr. 8, 2008

(54) METHOD FOR FABRICATING LEAD FRAME AND METHOD OF FABRICATING SEMICONDUCTOR DEVICE USING THE SAME

(75) Inventor: Ichiro Kishimoto, Osaka (JP)

(73) Assignee: Rohm Co., Ltd., Kyoto-shi (JP)

( * ) Notice: Subject to any disclaimer, the term of this patent is extended or adjusted under 35 U.S.C. 154(b) by 155 days.

(21) Appl. No.: 10/954,652

(22) Filed: Oct. 1, 2004

(65) Prior Publication Data

US 2005/0104174 A1 May 19, 2005

(30) Foreign Application Priority Data

Oct. 6, 2003 (JP) ............................. 2003-347415

(51) Int. Cl.
*H01L 21/50* (2006.01)
*H01R 43/00* (2006.01)

(52) U.S. Cl. .................. 438/123; 29/827; 257/E23.031; 257/E21.499

(58) Field of Classification Search ................ 438/106, 438/110, 111, 121, 123; 29/592, 825, 827; 257/E23.031, E21.499, E21.506
See application file for complete search history.

(56) References Cited

U.S. PATENT DOCUMENTS

| | | | | |
|---|---|---|---|---|
| 4,137,546 A * | 1/1979 | Frusco | ................ | 257/670 |
| 5,522,133 A * | 6/1996 | Kawauchi | ................ | 29/874 |
| 6,143,981 A * | 11/2000 | Glenn | ................ | 174/534 |
| 6,197,615 B1 * | 3/2001 | Song et al. | ................ | 438/111 |
| 6,420,204 B2 * | 7/2002 | Glenn | ................ | 438/64 |
| 6,465,274 B2 * | 10/2002 | Carter et al. | ................ | 438/106 |
| 6,664,133 B2 | 12/2003 | Abe et al. | | |
| 6,700,189 B2 | 3/2004 | Shibata | | |
| 6,821,820 B2 * | 11/2004 | Inatsugu | ................ | 438/123 |
| 7,026,192 B2 * | 4/2006 | Minamio et al. | ................ | 438/123 |
| 2002/0180018 A1* | 12/2002 | Shermer | ................ | 257/679 |
| 2003/0006488 A1* | 1/2003 | Wakabayashi et al. | ................ | 257/666 |
| 2004/0046240 A1* | 3/2004 | Hasebe et al. | ................ | 257/678 |

FOREIGN PATENT DOCUMENTS

| | | |
|---|---|---|
| JP | 2003-158234 | 5/2003 |
| WO | WO 02/061835 | 8/2002 |

\* cited by examiner

*Primary Examiner*—Scott B. Geyer
(74) *Attorney, Agent, or Firm*—Rabin & Berdo, PC

(57) ABSTRACT

A method of fabricating a lead frame for a semiconductor device. The lead frame has a lead electrically connected to a semiconductor chip within sealing resin and sealed into the sealing resin such that at least a part of its lower surface is exposed from a lower surface of the sealing resin. The method includes a punching step for forming the lead by punching processing in a direction from the lower surface to its upper surface and a coining step for subjecting the lead to coining processing from the side of the upper surface after the punching processing.

8 Claims, 7 Drawing Sheets

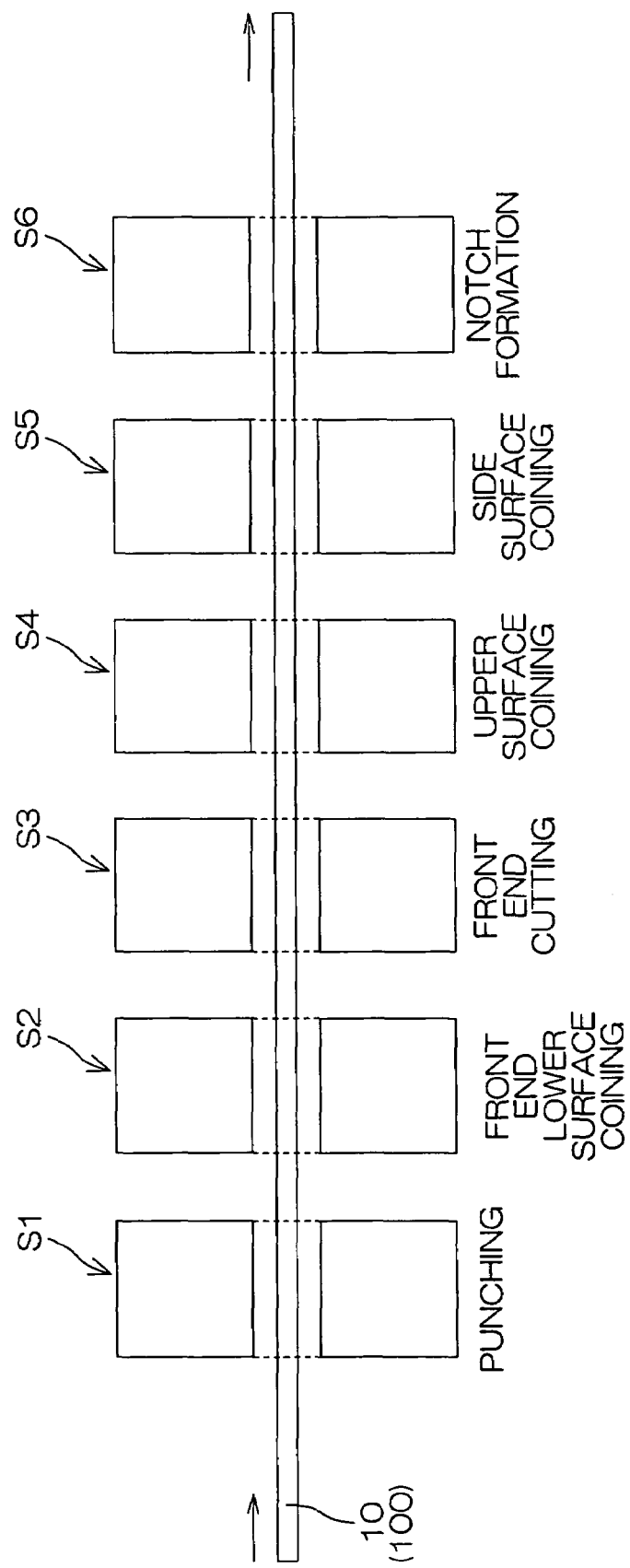

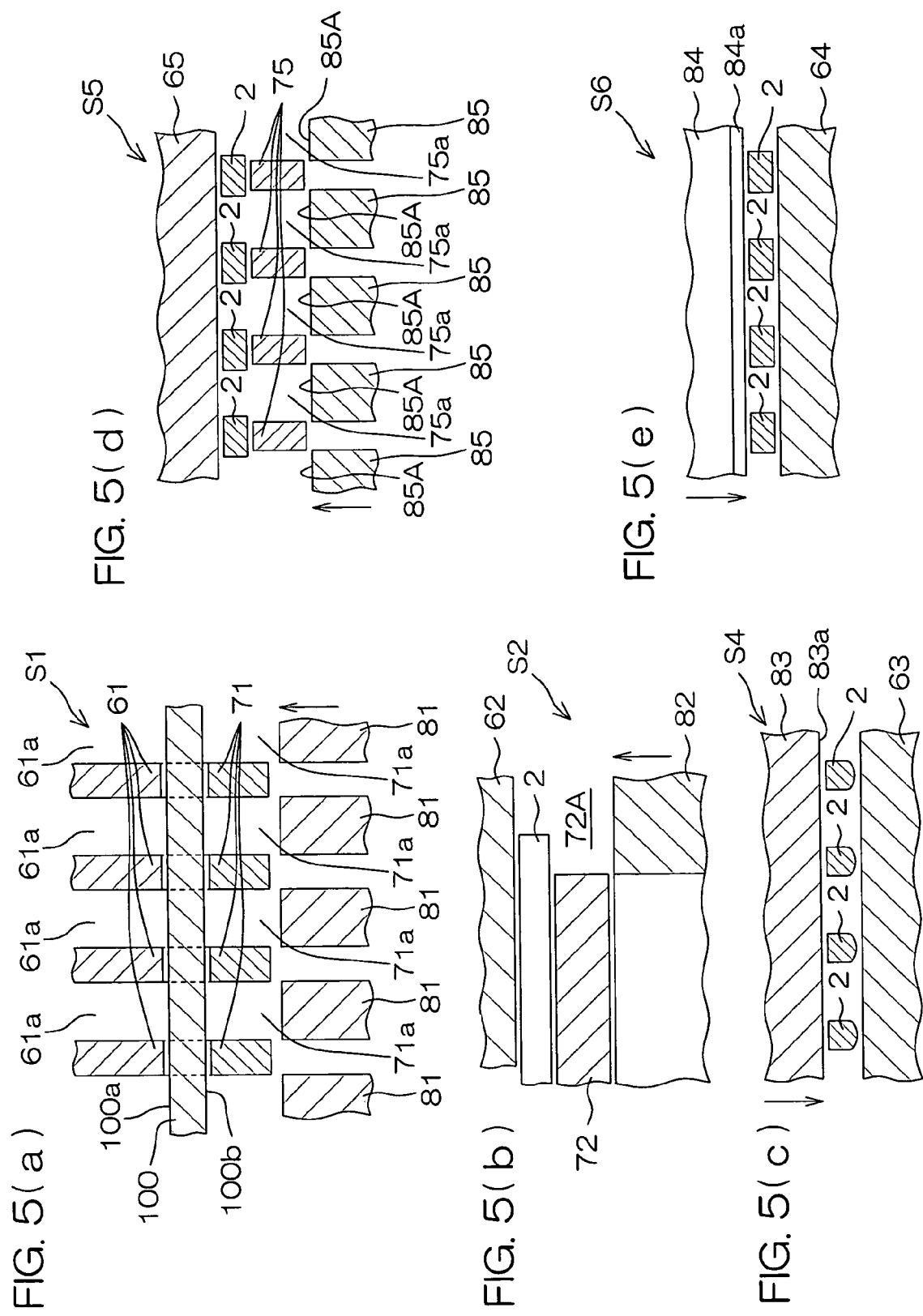

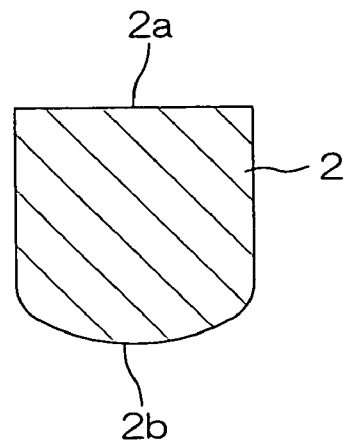
FIG. 6( a )
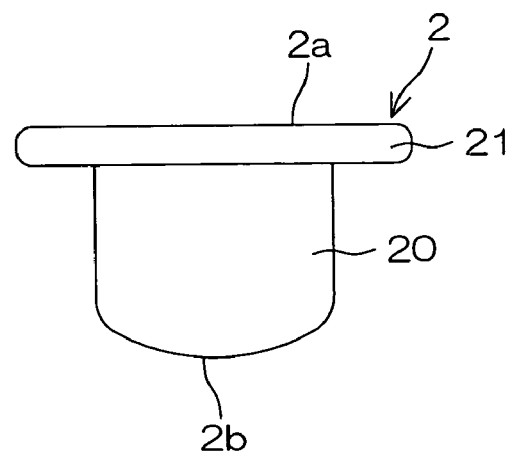
FIG. 6( b )
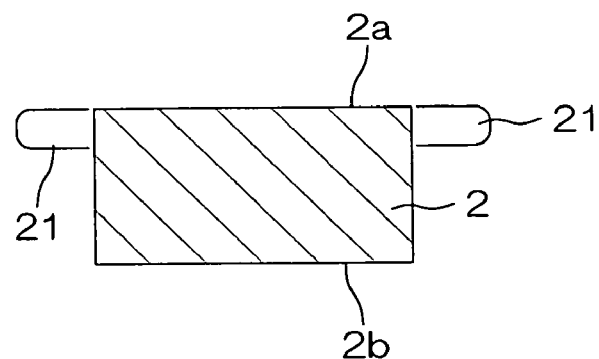
FIG. 6( c )
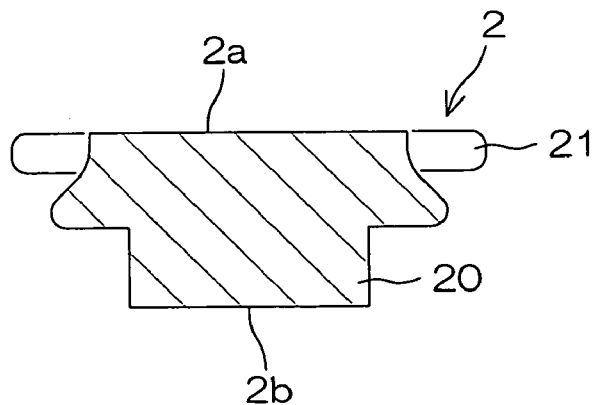
FIG. 6( d )

METHOD FOR FABRICATING LEAD FRAME AND METHOD OF FABRICATING SEMICONDUCTOR DEVICE USING THE SAME

BACKGROUND OF THE INVENTION

1. Field of the Invention

The present invention relates to a method of fabricating a lead frame for a semiconductor device fabricated by resin-sealing a semiconductor chip and a method of fabricating a semiconductor device using the same, and such a semiconductor device and a portable apparatus and an electronic apparatus comprising the same.

2. Description of Related Art

In order to high-density mount a semiconductor device on a wiring substrate, a package for high-density mounting allowing surface-mounting on the wiring substrate by eliminating extension of a lead from a mold resin package and exposing a lead (a terminal portion electrically connected to a semiconductor chip) of a lead frame to a lower surface of the package has been conventionally used. Known as such a package for high-density mounting have been leadless packages such as QFN (Quad Flat Non-leaded Package) and SON (Small Outlined Non-leaded Package).

In the packages in these forms, a lower surface of the lead sealed with mold resin, together with the semiconductor chip, is exposed to the lower surface of the package, so that the lead easily slips off the mold resin. Therefore, the lead can be prevented from slipping off by forming the lead into a reverse-tapered shape as disclosed in U.S. Pat. No. 6,664,133, rough-surfacing an upper surface of the lead as disclosed in Japanese Unexamined Patent Publication (KO-KAI) No. 2003-158234, or providing an offset in a part of the lead as disclosed in U.S. Pat. No. 6,700,189.

In order to form the lead having such a cross-sectional shape, the lead frame has been conventionally processed by etching. However, a long time is required for the processing, and the cost is increased. Therefore, the fabrication of the lead frame using a precision press mold (die) has been recently proposed, as disclosed in U.S. Pat. No. 6,664,133, for example.

In the method disclosed in U.S. Pat. No. 6,664,133, the lead frame is fabricated by subjecting a metal plate serving as a material for the lead frame to punching processing and pressing processing using a punch from the side of a lower surface of the lead frame, and stepped shapes for slipping prevention are respectively formed at a front end and a side surface of the lead.

In the case of the punching processing from the side of the lower surface of the lead frame, however, a sag occurs at a side edge on the lower surface of the lead so that the lead has a semi-round shape in cross section. The sag cannot be eliminated even by forming the stepped shape corresponding to the side surface of the lead by the subsequent pressing processing, so that the lower surface of the lead forms a curved surface projected downward.

When the lead frame, together with the semiconductor chip, is resin-sealed, therefore, the sealing resin may detour toward the lower surface of the lead to cover a part of the lower surface of the lead which should function as an outer lead. This results in inferior contact and defective products.

This problem can be solved by performing first punching processing from the side of an upper surface of the lead frame. In such a method, however, a burr projects toward the lower surface of the lead, which still causes the defective products.

SUMMARY OF THE INVENTION

An object of the present invention is to provide a method of fabricating a lead frame capable of preventing sealing resin from detouring toward a lower surface of a lead, and a method of fabricating a semiconductor device using the same.

Another object of the present invention is to provide a semiconductor device comprising a lead frame capable of preventing sealing resin from detouring toward a lower surface of a lead.

Still another object of the present invention is to provide a portable apparatus comprising the above-mentioned semiconductor device.

A further object of the present invention is to provide an electronic apparatus comprising the above-mentioned semiconductor device.

A method of fabricating a lead frame according to the present invention is for fabricating a lead frame having a lead electrically connected to a semiconductor chip within sealing resin and sealed into the sealing resin such that at least a part of its lower surface is exposed from a lower surface of the sealing resin. The method comprises a punching step for forming the lead by punching processing in a direction from the lower surface (an exposed surface exposed from the sealing resin) to its upper surface (a sealed surface sealed into the sealing resin); and a coining step for subjecting the lead to coining processing (e.g., coining processing of not less than 20 μm) from the side of the upper surface after the punching processing.

According to this method, the lead is formed by punching a hole in a metal plate as a material for the lead frame from the side of the lower surface (a surface exposed to a lower surface of a package of the semiconductor device in the final form). At this time, a sag occurs at a side edge on the lower surface of the lead, and the lower surface of the lead forms a curved surface projected downward. Thereafter by subjecting the lead to the coining processing from the side of the upper surface, however, the lower surface of the lead can be made flat. Consequently, the sag on the lower surface of the lead can be eliminated. In resin-sealing the lead frame, together with the semiconductor chip, therefore, the lower surface of the lead is not covered with the sealing resin, thereby making it possible to reduce the number of defective products.

Although the lower surface of the lead can be also made flat by the coining processing from the side of the lower surface, the lower surface of the lead is offset upward from the other portion of the lead frame. Therefore, the sealing resin may detour toward the lower surface of the lead.

The coining processing is performed, for example, by opposing the lower surface of the lead to a die having a flat surface and pressing the upper surface of the lead using a punch.

It is preferable that the coining processing step is the step of subjecting almost all of the whole area of the lead to the coining processing, and is the step of subjecting at least an area corresponding to a portion (an outer lead), which will be exposed to the lower surface of the sealing resin, in the lead to the coining processing.

It is preferable that the method further comprises a front end lower surface coining step for subjecting a front end of the lead (which refers to a front end nearer to the semiconductor chip after the resin sealing or a front end, in a case where there is a support for supporting the semiconductor chip, nearer to the support) to the coining processing from the side of the lower surface after the punching processing.

According to this method, the lower surface at the front end of the lead is subjected to the coining processing. Therefore, the lower surface at the front end of the lead is offset upward from the lower surface of the other portion of the lead, to form a front end slipping preventing portion. Consequently, the sealing resin detours below the lower surface at the front end of the lead, thereby making it possible to prevent the lead from slipping off the sealing resin.

The front end lower surface coining step may be carried out before the coining step for the lead.

It is preferable that the method further comprises a side edge shaping step for shaping a side edge of the lead from the side of the lower surface by a metal mold after the punching processing.

According to this method, the side edge on the lower surface of the lead is shaped from the side of the lower surface, so that the exposed portion (outer lead) exposed from the lower surface of the sealing resin (a package) of the semiconductor device can be formed in a desired shape, size, and arrangement. Consequently, the inferior connection of the semiconductor device can be prevented, thereby allowing the reliability thereof to be enhanced.

In shaping the side edge on the lower surface of the lead from the side of the lower surface, a space beside the lead is opened, unlike that in punching a hole in the metal plate, so that a portion receiving a pressing force from the metal mold (a punch) is coined while being enlarged sideward. Therefore, in this step, no substantial sag occurs at the side edge on the lower surface of the lead.

The side edge shaping step may be carried out after the coining processing step.

The side edge shaping step may be the step of forming a side surface slipping preventing portion sticking out to the side surface of the lead simultaneously by shaping from the side of the lower surface at the side edge of the lead. The side surface slipping preventing portion is offset upward from the lower surface of the lead (outer lead), so that the sealing resin detours below the lower surface. This allows the lead from slipping off.

The lead may have a longitudinal shape. In this case, it is preferable that the method further comprises the step of forming a notch in a groove shape along a direction crossing the longitudinal direction of the lead on the upper surface of the lead by metal mold processing. According to this method, the sealing resin enters the notch in a groove shape, thereby making it possible to prevent the lead from slipping off toward the longitudinal direction.

A method of fabricating a semiconductor device according to the present invention comprises the steps of fabricating a lead frame in the above-mentioned manner; electrically connecting the upper surface of the lead and the semiconductor chip; resin-sealing the lead frame, together with the semiconductor chip, such that at least a part of the lower surface of the lead is exposed from the lower surface; and cutting away an unnecessary part of the lead frame.

A semiconductor device according to the present invention is a semiconductor device having a semiconductor chip resin-sealed thereinto, comprising; the above-mentioned semiconductor chip; a lead frame having a lead electrically connected to the semiconductor chip within sealing resin and sealed into the sealing resin such that at least a part of its lower surface is exposed from a lower surface of the sealing resin and a support for mounting the semiconductor chip, the lower surface of the lead being a substantially flat surface, and a difference of elevation due to coining processing from the side of the upper surface of the lead occurring between the upper surface of the lead and an upper surface of the support; and the sealing resin for sealing the lead frame and the semiconductor chip such that the lower surface of the lead is exposed.

It is preferable that the plate thickness of the lead is smaller than the plate thickness of the support by the coining processing from the side of the upper surface of the lead. According to this configuration, as a result of the coining processing from the side of the upper surface of the lead, the plate thickness of the lead becomes smaller than the plate thickness of the support.

It is preferable that a plating layer for electrical connection to the semiconductor chip (e.g., a plating layer for wire bonding) is formed on the upper surface of the lead. This configuration allows the reliability of the electrical connection between the semiconductor chip and the lead to be enhanced.

It is preferable that the plating layer, together with the lead, is subjected to the coining processing (e.g., coining processing of not less than 20 µm) from the side of the upper surface of the lead.

In the case of this configuration, the lead is subjected to the coining processing from the side of the upper surface after the plating layer is formed on the lead. Consequently, plating processing and processing for removing an unnecessary part of the plating layer can be performed in a state where no step occurs on the upper surface of the lead, thereby making it easy to form the plating layer on the upper surface of the lead.

As a result of performing the coining processing from the side of the upper surface of the lead after forming the plating layer, a flaw caused by the coining processing is usually formed on the surface of the plating layer.

A portable apparatus according to the present invention comprises the above-mentioned semiconductor device. The semiconductor device can be made thin, and the reliability of the electrical connection to the wiring substrate is high. Therefore, the semiconductor device can contribute to miniaturization and thinning of the portable apparatus incorporating the same, and the reliability thereof can be improved.

An electronic apparatus according to the present invention comprises a wiring substrate, the above-mentioned semiconductor device surface-mounted on the wiring substrate by joining the lead thereto, and a case accommodating the wiring substrate on which the semiconductor device is mounted. The electronic apparatus having such a configuration can be made small and thin, and can have superior reliability.

Examples of the portable apparatus and the electronic apparatus include a portable telephone set, a PDA (Personal Digital Assistant), and a notebook-type personal computer.

The foregoing and other objects, features, aspects and advantages of the present invention will become more apparent from the following description of the preferred embodiments of the present invention when taken in conjunction with the accompanying drawings.

BRIEF DESCRIPTION OF THE DRAWINGS

FIG. 4 is a conceptual diagram for explaining the configuration of a precision press device used for fabricating the lead frame;

FIGS. 5(a) to 5(e) are illustrative sectional views for explaining the configuration of each of press stations in the precision press device;

FIGS. 6(a) to 6(d) are diagrams for explaining a change in the shape of a lead in a lead frame fabricating step.

DESCRIPTION OF THE PREFERRED EMBODIMENTS

Figure 1:
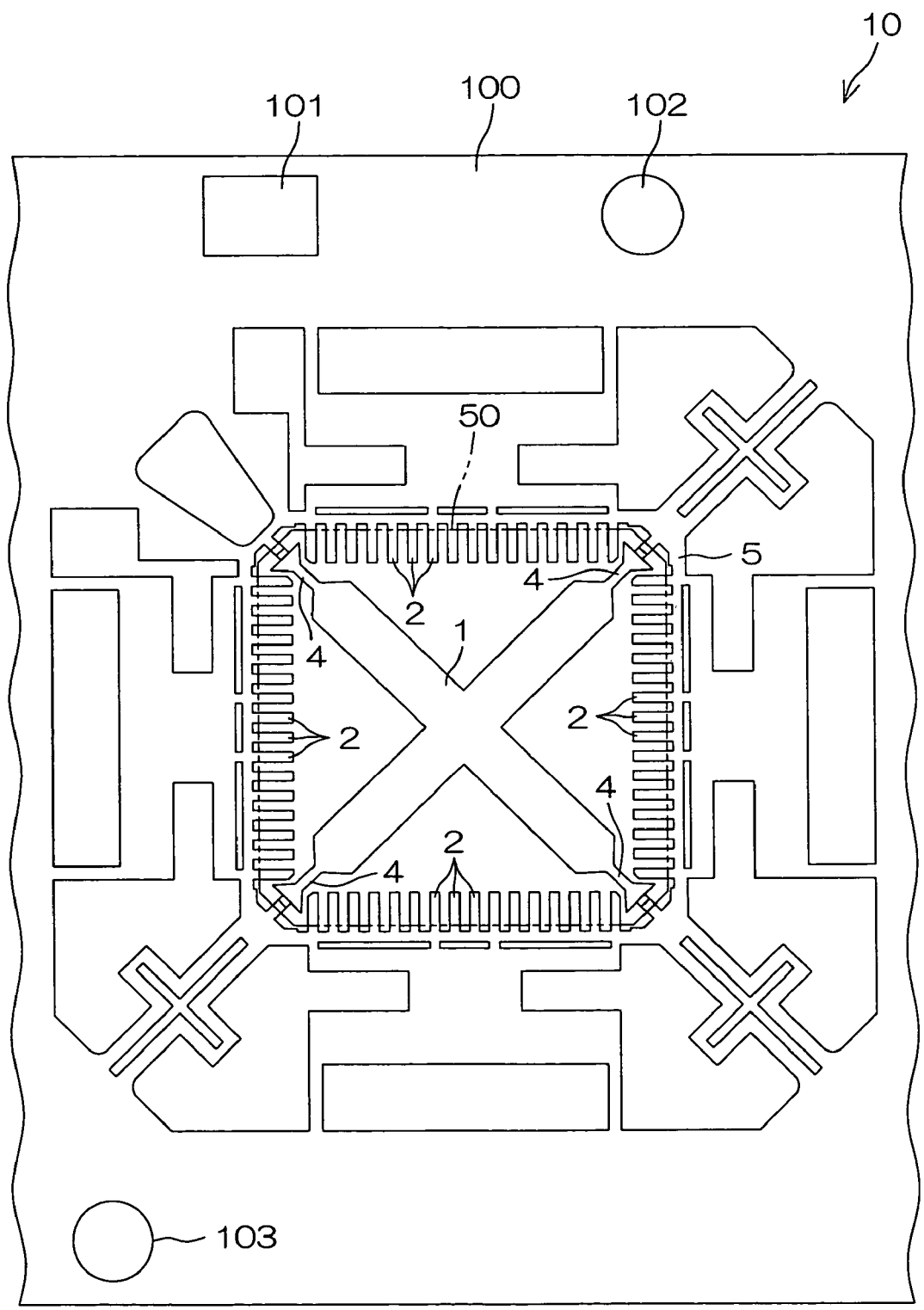
FIG. 1 is a plan view showing the configuration of a lead frame according to an embodiment of the present invention.

FIG. 1 is a plan view showing the configuration of a lead frame according to an embodiment of the present invention. FIG. 1 illustrates a unit portion corresponding to one semiconductor device. In practice, however, unit portions corresponding to a plurality of semiconductor devices are connected to one another in a left-to-right direction in FIG. 1, thereby constituting a band-shaped chain member as a whole.

The lead frame 10 is fabricated by subjecting a metal plate (particularly a copper plate, for example, having a plate thickness of about 200 μm) 100 to precision press processing. A unit portion corresponding to one semiconductor device has a rectangular shape (an approximately square shape in an example of FIG. 1), and has a support (an island) 1 for supporting a semiconductor chip at its center and has a plurality of leads 2 arranged at approximately equal spacing so as to imaginarily form a rectangular shape around its periphery.

The support 1 has a substantially X shape as viewed from the top and is coupled to a frame 5 connecting with the metal plate 100 through hang leads 4 at four corners of the imaginary rectangular shape formed by the plurality of leads 2 in the present embodiment. Each of the leads 2 has a longitudinal shape arranged with its front end directed toward the center, and has its base end coupled to the frame 5. The plurality of leads 2 arranged along each of the sides of the imaginary rectangular shape are substantially parallel to one another, and the longitudinal direction thereof is along a direction nearly perpendicular to the side. Reference numerals 101, 102, and 103 are positioning holes for positioning the lead frame 10 in a processing step in each of press stations in a precision press device, a mounting step for mounting the semiconductor chip, a sealing step for sealing with the sealing resin, and so on.

Figure 2:
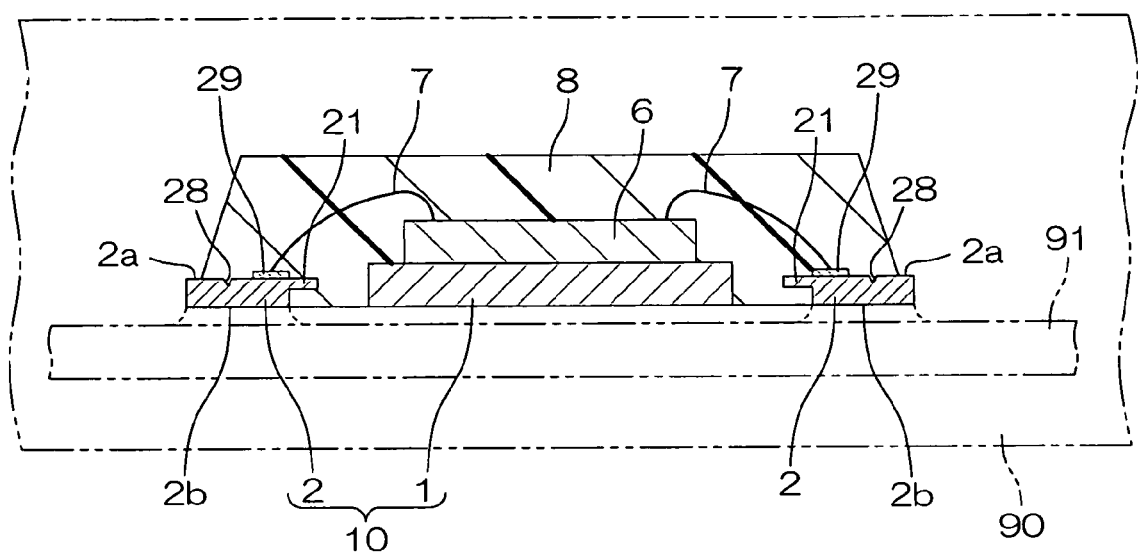
FIG. 2 is an illustrative sectional view showing the configuration of a semiconductor device having the lead frame incorporated therein.

FIG. 2 is an illustrative sectional view showing the configuration of a semiconductor device having the above-mentioned lead frame 10 incorporated therein. The semiconductor device comprises the lead frame 10, a semiconductor chip 6 mounted on the support 1 in the lead frame 10, a bonding wire 7 for electrically connecting the semiconductor chip 6 and an upper surface 2a of the lead 2, and sealing resin 8 for sealing them. A lower surface 2b of the lead 2 is exposed from a lower surface of the sealing resin 8, and functions as an outer lead to be soldered and joined to a wiring pattern on a circuit board. Further, a portion sealed into the sealing resin in the lead 2 functions as an inner lead, and a portion near to its front end is an inner connecting portion to which the bonding wire 7 is joined. A surface-mounting type semiconductor package (QFN) is thus configured.

The semiconductor device is surface-mounted on a wiring substrate 91 by soldering and joining the lower surface 2b of the lead 2 thereto. The wiring substrate 91 on which the semiconductor device is mounted is employed, for example, in a state where it is accommodated within a case 90 of a portable apparatus such as a portable telephone set.

In assembling the semiconductor device, the semiconductor chip 6 is die-bonded to an upper surface of the support 1, and a terminal of the semiconductor chip 6 and the upper surface 2a of the lead 2 are connected to each other by the bonding wire 7. Thereafter, a sealing area 50 indicated by a two-dot and dash line in FIG. 1 is resin-sealed. Consequently, the semiconductor chip 6, the bonding wire 7, and the lead 2 are resin-sealed to form a package. Thereafter, the lead 2 and the hang lead 4 are cut along a side surface of the package, and are cut away from the frame 5. Respective pieces of the semiconductor device are thus obtained.

Figure 3A:
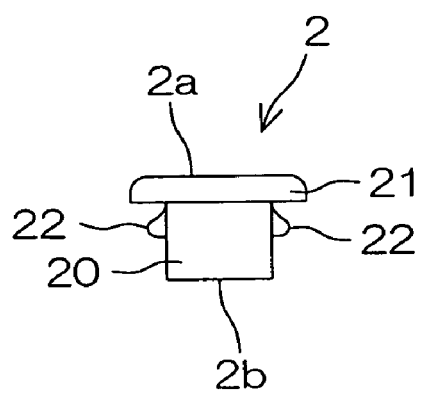
FIG. 3(a) is a front view as viewed from a front end of a lead.
Figure 3C:
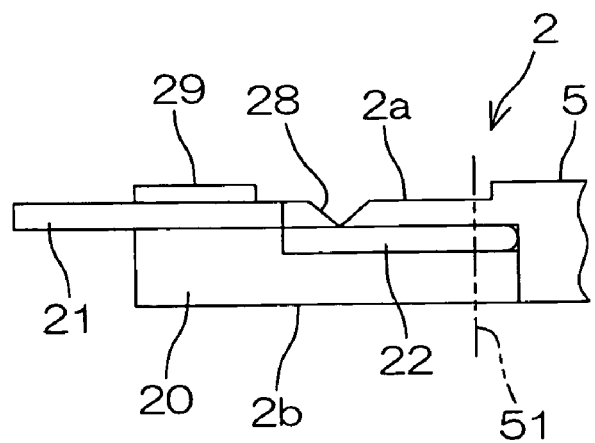
FIG. 3(c) is a side view thereof.
Figure 3B:
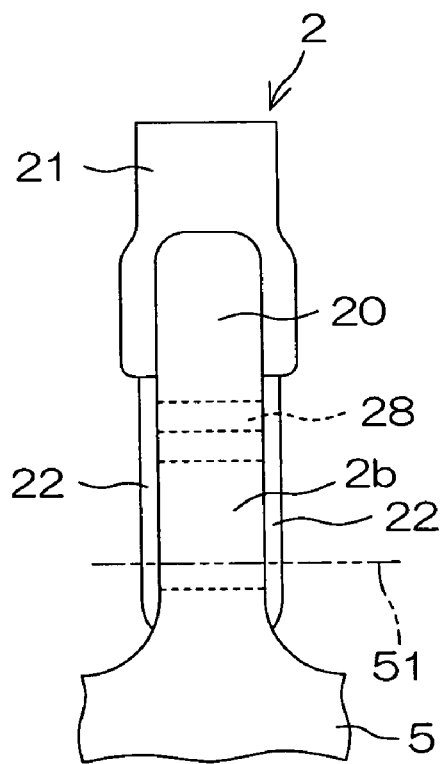
FIG. 3(b) is a bottom view thereof.

FIG. 3(a) is a front view as viewed from the front end of the lead 2, FIG. 3(b) is a bottom view thereof, and FIG. 3(c) is a side view thereof. The lead 2 is subjected to coining processing from the side of the upper surface 2a of the lead 2 in its area leading to the front end from a position nearer to the base end with respect to a cutting line 51 along which it is cut after being resin-sealed, the upper surface 2a is lower than the upper surfaces of the frame 5 and the support 1, and the plate thickness thereof (e.g., about 170 μm) in the area is smaller than the plate thicknesses of the frame 5 and the support 1 (e.g., less than about 200 μm) (also see FIG. 2). A notch 28 having an approximately V shape in cross section is formed along a direction nearly perpendicular to the longitudinal direction of the lead 2 on the upper surface 2a of the lead 2. The notch 28 prevents the lead 2 from slipping off the sealing resin 8 along the longitudinal direction.

On the upper surface 2a of the lead 2, an area nearer to the front end of the lead 2 (nearer to the support 1) from the notch 28 functions as a wiring connecting portion (an inner connecting portion) to which the bonding wire 7 is joined. A plating layer 29 (e.g., a silver plating layer) for achieving good joining to the bonding wire 7 is formed in the wire connecting portion. On the other hand, the lower surface 2b of the lead 2, together with the semiconductor chip 6, is resin-sealed and is then exposed from the lower surface of the sealing resin 8, to function as an outer connecting portion (an outer lead) for surface-mounting on a circuit board.

An area at the front end of the lead 2 is subjected to coining processing from the side of the lower surface 2b of the lead 2, and a front end slipping preventing portion 21 offset upward from the lower surface 2b of the lead 2 is formed. The front end slipping preventing portion 21 sticks out toward its front end and side surfaces in the vicinity of an upper surface of a main body 20 of the lead 2. In a state where the lead 2, together with the semiconductor chip 6, is resin-sealed, the sealing resin 8 detours below the front end slipping preventing portion 21, thereby preventing the lead 2 from slipping off.

Slipping preventing steps 22 are formed over almost all of the areas on both side surfaces of the main body 20 of the lead 2. The slipping preventing steps 22 are formed so as to extend over an area leading to the cutting line 51 from a position at a rear end (an edge at a base end) of the front end slipping preventing portion 21 at an intermediate position in the thickness direction of the main body 20. The slipping preventing steps 22 stick out of both the side surfaces of the main body 20, and its lower surface is offset upward from the lower surface 2b of the lead 2. When the lead 2, together with the semiconductor chip 6, is resin-sealed, therefore, the sealing resin 8 detours below the slipping preventing steps 22. Consequently, the lead 2 is prevented from slipping off.

The slipping preventing step 22 is formed by being subjected to pressing processing using a metal mold (a punch) from the side of the lower surface 2b of the lead 2. Therefore, the lower surface 2b has a predetermined size and shape, and lower surfaces 2b of a plurality of leads 2 have a desired arrangement. Consequently, the lower surfaces 2b of the plurality of leads 2 satisfactorily function as an outer connecting portion.

As shown in FIG. 3(*a*), the lower surface 2b of the lead 2 is a substantially flat surface. If the lower surface of the lead frame 10 is resin-sealed by being pressed against the metal mold, therefore, the sealing resin does not detour below the lower surface 2b, thereby causing no inferior conduction by attachment of the sealing resin 8.

FIG. 4 is a conceptual diagram for explaining the configuration of the precision press apparatus used for fabricating the lead frame 10. The lead frame 10 is conveyed in a forward direction (rightward in FIG. 4) successively through a plurality of (six in the example shown in FIG. 4) press stations S1 to S6. The press station S1 is a punching processing portion for subjecting the band-shaped metal plate 100 as a material to punching processing from the side of its lower surface. The press station S2 is a front end lower surface coining processing portion for subjecting the front end of the lead 2 to coining processing from the side of the lower surface of the lead 2. The press station S3 is a cutting processing portion for cutting the front end of the lead 2 at a cutting position which is at a predetermined distance from the base end of the lead 2. The press station S4 is a coining processing portion for subjecting the whole of the lead 2 to coining processing from the side of the upper surface of the lead 2. The press station S5 is a side surface coining processing portion for shaping the lower surface 2b of the lead 2 by coining processing from the side of both the side surfaces of the lead 2. The press station S6 is a notch formation processing portion for forming the V-shaped notch 28 in an intermediate part of the upper surface 2a of the lead 2.

FIG. 5(*a*) is an illustrative sectional view showing the configuration of the press station S1 (punching processing portion), showing a cross section taken along a plane crossing the longitudinal direction of the lead 2. In the press station S1, the band-shaped metal plate 100 is subjected to punching processing from the side of the lower surface 100b. More specifically, the metal plate 100 is inserted between a die 61 and a holding member 71 respectively having openings 61a and 71a corresponding to a pattern of the support 1, the lead 2, or the like. In this state, a punch 81 having a shape aligned with the openings 61a and 71a passes through the openings 71a and 61a in this order such that it makes a hole in the metal plate 100 in a direction from the lower surface 100b to its upper surface 100a, and is then moved up and down such that it retreats from the openings 61a and 71a. Consequently, the support 1 and the lead 2 are formed by punching processing from the lower surface 2b of the lead 2. At this time, a cross section crossing the longitudinal direction of the lead 2 has a reverse semi-round shape, as shown in FIG. 6(*a*). That is, the lower surface 2b has a curved surface projected downward, and sags respectively occur at both their side edges.

FIG. 5(*b*) is an illustrative sectional view showing the configuration of the press station S2 (front end lower surface coining processing portion), showing a state as viewed from the side surface of the lead 2. In the press station S2, the front end slipping preventing portion 21 is formed by coining processing from the side of the lower surface at the front end of the lead 2 obtained by punching processing. More specifically, a die 62 having a flat lower surface is arranged above the lead 2, and a holding member 72 is arranged below the metal plate 100. A punch 82 is moved up and down with a predetermined stroke through an opening 72A formed in the holding member 72.

Figure 7:
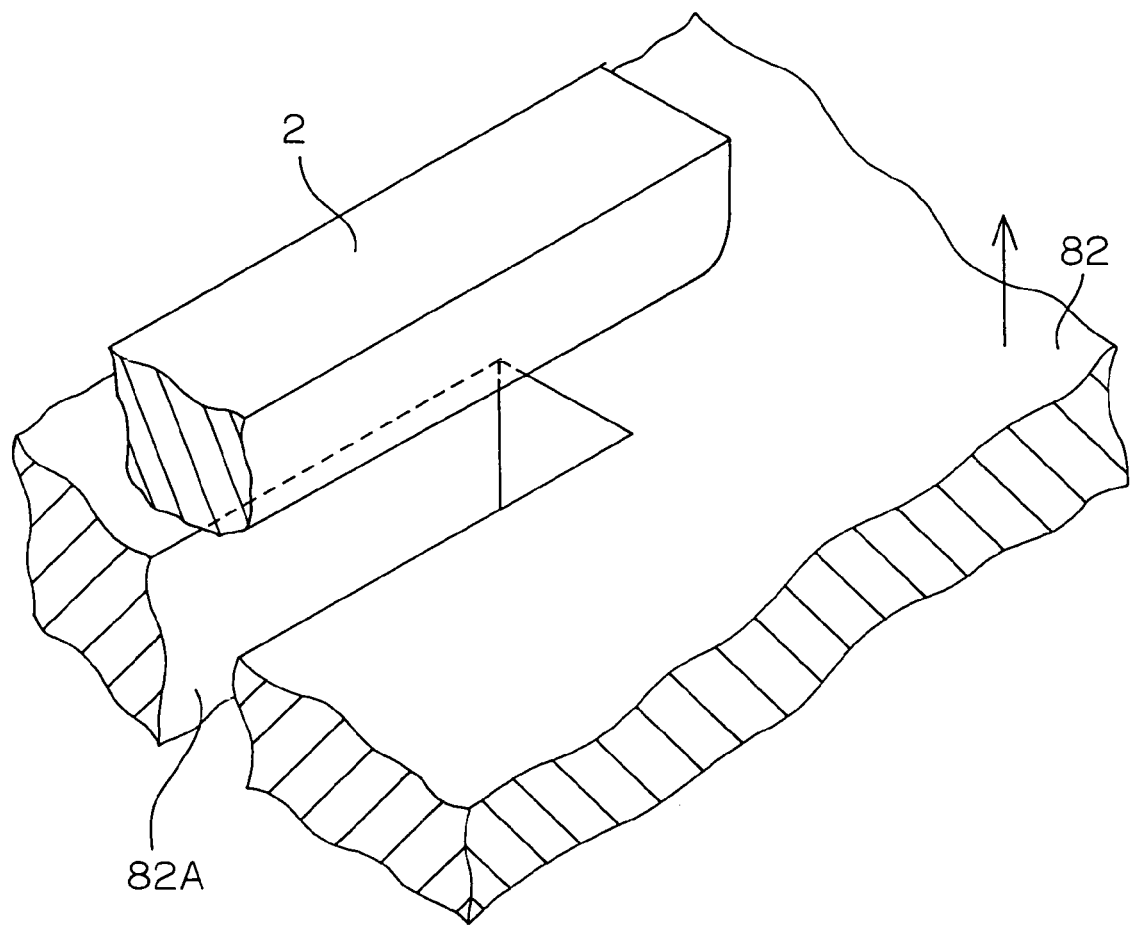
FIG. 7 is an illustrative perspective view showing the configuration of a punch for front end lower surface coining processing.

The punch 82 has a recess 82A in a rectangular shape as viewed from the top formed in a width approximately equal to the width of the lead 2, and is overlapped with the front end of the lead 2 in an innermost part of the recess 82A, as shown in FIG. 7. Therefore, the front end of the lead 2 is coined and is offset upward from the lower surface 2b of the lead 2, and a flared portion sticking out of the side surface of the main body 20 is formed at a position slightly nearer to the base end of the lead 2 from the offset portion. Consequently, the above-mentioned front end slipping preventing portion 21 is formed.

The stroke of the punch 82 is so determined as to be lowered after an upper end of the punch 82 is moved to an intermediate portion of the plate thickness of the metal plate 100 (e.g., a position nearer to the upper surface from the intermediate position of the plate thickness). Therefore, the front end slipping preventing portion 21 sticks out toward the front end and both the sides of the main body 20 at a position near to the upper surface 2a of the lead 2.

FIG. 6(*b*) is a front view showing a state where the front end slipping preventing portion 21 has been formed. At this time point, the main body 20 of the lead 2 still has a reverse semi-round shape in cross section, and a sag occurs in the lower surface 2b.

FIG. 5(*c*) is an illustrative sectional view showing the configuration of the press station S4 (coining processing portion), showing a cross section taken along a plane crossing the longitudinal direction of the lead 2. After the front end slipping preventing portion 21 is cut to a predetermined length in the press station S3, the entire lead 2 is subjected to coining processing in the press station S4. That is, in the press station S4, a die 63 having a flat upper surface is arranged below the lead 2, and a holding member (not shown) for pressing portions, corresponding to the support 1 and the like, other than the lead 2 is arranged above the metal plate 100, as shown in FIG. 5(*c*). The holding member is provided with an opening for exposing the entire lead 2, and is provided with a punch 83 having a flat lower surface so as to be movable up and down through the opening. The punch 83 has a pressing surface 83a which can press the entire lead 2 (at least an area including the entire area nearer to the front end with respect to the cutting line 51).

The up-and-down stroke of the punch 83 is so set that the position of a lower dead point of the pressing surface 83a is below (e.g., only 30 μm below) the upper surface 2a of the lead 2 before the coining processing. More specifically, the position of the lower dead point of the pressing surface 83a is so determined that the lower surface 2b of the lead 2 can be made substantially flat by eliminating the sag in the lower surface 2b of the lead 2 before the coining processing. Consequently, the transverse section of the main body 20 after the coining processing of the lead 2 becomes approximately rectangular, as shown in FIG. 6(*c*).

FIG. 5(*d*) is an illustrative sectional view showing the configuration of the press station S5 (side surface coining processing portion), showing a cross section taken along a plane crossing the longitudinal direction of the lead 2. In the press station S5, a die 65 having a flat lower surface is arranged above the lead 2, and holding members 75 respectively having openings 75a wider than spacing between the adjacent leads 2 at corresponding positions between the adjacent leads 2 are arranged below the lead 2. A punch 85 which moves up and down through the opening 75a is arranged below the holding member 75. The punch 85 has a pressing surface 85A wider than the spacing between the adjacent leads 2 at its upper end.

The stroke of the punch 85 is so determined that the position of its upper dead point is within the range of the plate thickness of the main body 20 of the lead 2 (e.g., an intermediate position of the plate thickness, i.e., a position below the front end slipping preventing portion 21). Consequently, both side edges of the main body 20 of the lead 2 are pressed upward from the lower surface 2b by moving the punch 85 up and down, and the slipping preventing steps 22 are respectively formed at the intermediate position of the plate thickness of the main body 20 on both the side surfaces of the main body 20. The lower surface 2b of the main body 20 is correspondingly shaped to a width between the adjacent punches 85, to have a predetermined size, shape, and arrangement.

The transverse section of the main body 20 after the side surface coining processing is shown in FIG. 6(d). At the time of the side surface coining processing, a space beside the main body 20 of the lead 2 is a free space, as shown in FIG. 5(d); therefore, a portion coined by the punch 85 easily spreads sideward. Therefore, the lower surface 2b after the processing is a substantially flat surface without causing a sag at a side edge of the lower surface 2b, unlike that in the case of punching processing.

FIG. 5(e) is an illustrative sectional view showing the configuration of the press station S6 (notch formation processing portion), showing a cross section taken along a plane crossing the longitudinal direction of the lead 2. In the press station S6, a die 64 having a flat upper surface is arranged below the lead 2, a holding member (not shown) having an opening in a slit shape (in a slit shape nearly perpendicular to the longitudinal direction of the lead 2) is arranged at an intermediate position in the longitudinal direction of the main body 20 of the lead 2, and a plate-shaped punch 84 which moves through the opening is further provided. The punch 84 has a wedge-shaped pressing portion 84a at its front end (lower end).

The up-and-down stroke of the punch 84 is so determined that the lower end of the pressing portion 84a reaches a position within the range of the plate thickness of the lead 2. Consequently, a notch 28 having a V shape in cross section can be formed in an intermediate part in the longitudinal direction of the lead 2 by moving the punch 84 up and down.

When the lead frame 10 is thus formed through the press stations S1 to S6, a wire connecting portion is subjected to plating processing (e.g., silver plating processing).

The plating processing may be performed before the coining processing by the press station S4. Consequently, the lead 2 is subjected to coining processing from the side of the upper surface 2a after the plating layer 29 is formed on the upper surface 2a. Consequently, plating processing and processing for removing an unnecessary part of the plating layer can be performed in a state where no step occurs on the upper surface 2a of the lead 2, thereby making it easy to form the plating layer 29 on the upper surface 2a of the lead 2. In this case, the plating layer 29 is also subjected to coining processing from the side of the upper surface, so that a flaw caused by the coining processing is usually formed on the surface of the plating layer 29.

Although description has been made of an embodiment of the present invention, the present invention can also be embodied by another embodiment. Although in the above-mentioned embodiment, description has been made of an example in which the lead 2 and the semiconductor chip 6 are electrically connected to each other through the bonding wire, a bump may be provided at a terminal portion of the semiconductor chip, and may be joined to the upper surface 2a of the lead 2.

Although in the above-mentioned embodiment, in the step of processing the metal plate 100 to fabricate the lead frame 10, processing by each of the press stations S1 to S6 is performed in a state where the upper surface of the lead frame 10 is directed upward and the lower surface thereof is directed downward, the processing in each of the steps may be performed in a state where the upper surface of the lead frame 10 is directed downward and the lower surface thereof is directed upward. In this case, the vertical relationship among the punch, the holding member, and the die in each of the press stations S1 to S6 is preferably reversed.

Although in the above-mentioned embodiment, a series of processing steps for fabricating the lead frame 10 is continuously performed by one precision press apparatus, some of the steps may be performed by another apparatus.

Although the present invention has been described and illustrated in detail, it is clearly understood that the same is by way of illustration and example only and is not to be taken by way of limitation, the spirit and scope of the present invention being limited only by the terms of the appended claims.

The present application corresponds to Japanese Patent application No. 2003-347415 filed with the Japanese Patent Office on Oct. 6, 2003, the disclosure of which is herein by reference.

What is claimed is:

1. A method of fabricating a lead frame for a semiconductor device, the lead frame having a lead to be electrically connected to the semiconductor chip within sealing resin, the lead being to be sealed into the sealing resin such that at least a part of a lower surface thereof is exposed from a lower surface of the sealing resin, the method comprising:
   a punching step for forming the lead by punching processing in a direction from the lower surface to an upper surface thereof;
   a coining step for subjecting the lead to coining processing from a side of the upper surface thereof after the punching processing,
   a front end lower surface coining step for subjecting a front end of the lead to coining processing from a side of the lower surface after the punching processing; and
   a side edge shaping step for shaping a side edge of the lead by a metal mold after the punching processing, the side edge shaping step being performed on a region of the lead spaced apart from the front end of the lead.

2. The method according to claim 1, wherein
   the lead has a longitudinal shape,
   the method further comprising the step of forming a notch in a groove shape along a direction crossing the longitudinal direction of the lead on the upper surface of the lead by metal mold processing.

3. A method of fabricating a semiconductor device, comprising:
   a lead frame fabricating step including a punching step for forming a lead by punching processing in a direction from a lower surface thereof to an upper surface thereof, a coining step for subjecting the lead to coining processing from a side of the upper surface after the punching processing, a front end lower surface coining step for subjecting a front end of the lead to coining processing from a side of the lower surface after the punching processing, and a side edge shaping step for shaping a side edge of the lead by a metal mold after the punching processing, the side edge shaping step being performed on a region of the lead spaced apart from the front end of the lead;

a step of electrically connecting the upper surface of the lead and a semiconductor chip;

a step of resin-sealing the lead frame, together with the semiconductor chip, such that at least a part of the lower surface of the lead is exposed from a lower surface of a sealing resin; and a step of cutting away an unnecessary part of the lead frame.

4. A method for fabricating a lead frame for a semiconductor device, comprising the steps of:

punching a member from a flat metal plate, the member including a lead having a top side, a bottom side, a left side that extends between the top and bottom sides, and a right side that extends between the top and bottom sides, the bottom side of the lead being curved;

performing a first coining operation to form a slip preventing portion at the top side of the lead, the slip preventing portion extending outward from the left and right sides of the lead;

performing a second coining operation to form slip preventing steps that project outward from the left and right sides of the lead, the distance between the slip preventing steps and the bottom side of the lead being smaller than the distance between the slip preventing portion and the bottom side of the lead; and performing a third coining operation to flatten the bottom side of the lead.

5. The method of claim 4, wherein the first coining operation is performed before the second coining operation.

6. The method of claim 5, wherein the third coining operation is performed after the second coining operation.

7. The method of claim 4, further comprising the step of forming a notch on the top side of the lead.

8. The method of claim 7, further comprising the step of cutting the lead at a location spaced apart from the notch.

* * * * *